United States Patent
Huang et al.

(10) Patent No.: US 11,422,175 B2
(45) Date of Patent: Aug. 23, 2022

(54) LIVE MEASUREMENT METHOD FOR THREE-WINDING TRANSFORMER LOSS BASED ON WINDOWED FREQUENCY SHIFT

(71) Applicants: STATE GRID JIANGSU ELECTRIC POWER CO., LTD., Nanjing (CN); STATE GRID JIANGSU ELECTRIC POWER CO., LTD. MARKETING CENTER, Nanjing (CN)

(72) Inventors: Qifeng Huang, Nanjing (CN); Xiaoquan Lu, Nanjing (CN); Shihai Yang, Nanjing (CN); Mingming Chen, Nanjing (CN); Zhixin Li, Nanjing (CN); Bo Li, Nanjing (CN); Huiling Su, Nanjing (CN); Xiaodong Cao, Nanjing (CN); Yuqin Chen, Nanjing (CN); Hanmiao Cheng, Nanjing (CN); Tianchang Liu, Nanjing (CN); Yixuan Huang, Nanjing (CN); Kaijie Fang, Nanjing (CN)

(73) Assignees: STATE GRID JIANGSU ELECTRIC POWER CO., LTD., Nanjing (CN); STATE GRID JIANGSU ELECTRIC POWER CO., LTD. MARKETING CENTER, Nanjing (CN)

(*) Notice: Subject to any disclaimer, the term of this patent is extended or adjusted under 35 U.S.C. 154(b) by 0 days.

(21) Appl. No.: 17/081,726

(22) Filed: Oct. 27, 2020

(65) Prior Publication Data

US 2021/0364562 A1  Nov. 25, 2021

(30) Foreign Application Priority Data

May 21, 2020 (CN) .......................... 202010437792.4

(51) Int. Cl.
*G01R 31/00* (2006.01)
*G01R 27/26* (2006.01)
*G01R 31/62* (2020.01)

(52) U.S. Cl.
CPC ......... *G01R 27/2694* (2013.01); *G01R 31/62* (2020.01)

(58) Field of Classification Search
CPC .... G01R 27/2694; G01R 31/00; G01R 31/62; G01R 27/26
See application file for complete search history.

(56) References Cited

FOREIGN PATENT DOCUMENTS

| CN | 107797017 A | * | 3/2018 | ............. G01R 31/62 |
| CN | 209728059 U | * | 12/2019 | ............. G01R 27/26 |

OTHER PUBLICATIONS

Search translated Deny et al. CN107797017A (Year: 2018).*
Search translated Zhang et al. CN-209728059-U (Year: 2019).*

* cited by examiner

*Primary Examiner* — Jermele M Hollington
*Assistant Examiner* — Courtney G McDonnough
(74) *Attorney, Agent, or Firm* — ArentFox Schiff LLP

(57) ABSTRACT

Provided is a live measurement method for three-winding transformer loss based on windowed frequency shift. The method includes: step 1: providing an improved live calculation equation of a three-winding transformer loss; step 2: processing a collected x(t) signal by windowed frequency shift calculation; step 3: solving an amplitude and a phase of the collected x(t) signal via discrete Fourier transform of a frequency shift signal; and step 4: calculating a no-load loss and a load loss of a three-winding transformer.

5 Claims, 2 Drawing Sheets

LIVE MEASUREMENT METHOD FOR THREE-WINDING TRANSFORMER LOSS BASED ON WINDOWED FREQUENCY SHIFT

CROSS-REFERENCES TO RELATED APPLICATIONS

This application claims priority to Chinese patent application No. CN202010437792.4 filed at the CNIPA on May 21, 2020, the disclosure of which is incorporated herein by reference in its entirety.

TECHNICAL FIELD

The present invention relates to the field of transformer detection technologies and specifically, to a live measurement method for three-winding transformer loss based on windowed frequency shift.

BACKGROUND

The transformer is a sort of electric equipment widely used in the electric power industry, and its operation reliability directly affects safety and stability of the electric power system. The transformer loss is one of important parameters which reflect the operating state of the transformer. Accurate calculation and analysis of the transformer loss value is of great significance for defining the grid annual loss characteristics, analyzing the line loss constitution of a power system and reasonably planning the grid construction.

The transformer loss is classified into the no-load loss and the load loss. The no-load loss reflects integral defects of the transformer, the winding inter-turn short circuit and problems occurring in the magnetic circuit, while the load loss reflects internal defects of the transformer, winding deformation, etc. The conventional detection method is to obtain transformer parameters by means of the off-line test (no-load test and load test) and calculate the no-load loss and load loss. This method, as a detection manner which performs static energy efficiency measurement on the transformer, ignores transformer losses caused by effects of actual load in the grid, the actual grid state and other factors, and introduces large errors, and thus cannot accurately measure the transformer loss in the actual operation. Furthermore, the on-line measurement of the transformer loss needs to deal with a variety of signals, and requires high synchronization. Since there is frequency fluctuation in a certain range in the actual operation of the grid, the limitation of signal length and the non-synchronization of sampling will lead to spectrum leakage and picket fence effect.

SUMMARY

The present invention provides a live measurement method for three-winding transformer loss based on windowed frequency shift. The method can provide data support for on-line diagnosis, loss reduction and energy saving of the transformer.

In order to achieve this purpose, the live measurement method for three-winding transformer loss based on windowed frequency shift designed in the present invention includes steps 1-4 described below.

In step 1, an improved live calculation equation for the three-winding transformer loss is established by using a three-winding transformer equivalent circuit, and an instantaneous voltage value $v_1$ of a high-voltage side of a three-winding transformer, an instantaneous current value $i_1$ of a high-voltage side of the three-winding transformer, an instantaneous reduction value $v_2'$ of a medium-voltage side voltage at a high-voltage side in the three-winding transformer, an instantaneous reduction value $i_2'$ of a medium-voltage side current at the high-voltage side in the three-winding transformer, an instantaneous reduction value $v_3'$ of a low-voltage side voltage of the three-winding transformer at the high-voltage side, and an instantaneous reduction value $i_3'$ of a low-voltage side current of the three-winding transformer at the high-voltage side are determined according to the improved live calculation equation for the three-winding transformer loss.

In step 2, windowed discrete-time Fourier transform equations of an instantaneous voltage signal of the high-voltage side of the three-winding transformer, an instantaneous current signal of the high-voltage side of the three-winding transformer, an instantaneous reduction signal of the medium-voltage side voltage at the high-voltage side in the three-winding transformer, an instantaneous reduction signal of the medium-voltage side current at the high-voltage side in the three-winding transformer, an instantaneous reduction signal of the low-voltage side voltage of the three-winding transformer at the high-voltage side, and an instantaneous reduction signal of the low-voltage side current of the three-winding transformer at the high-voltage side are calculated by using a windowing algorithm.

In step 3, frequency shift processing is performed on the windowed discrete-time Fourier transform equations obtained in step 2, and Fourier transform is performed on the frequency-shifted discrete-time Fourier transform equations to obtain amplitudes and phases of the instantaneous voltage signal of the high-voltage side of the three-winding transformer, the instantaneous current signal of the high-voltage side of the three-winding transformer, the instantaneous reduction signal of the medium-voltage side voltage at the high-voltage side in the three-winding transformer, the instantaneous reduction signal of the medium-voltage side current at the high-voltage side in the three-winding transformer, the instantaneous reduction signal of the low-voltage side voltage of the three-winding transformer at the high-voltage side, and the instantaneous reduction signal of the low-voltage side current of the three-winding transformer at the high-voltage side.

In step 4, the amplitudes and the phases of the instantaneous voltage signal of the high-voltage side of the three-winding transformer, the instantaneous current signal of the high-voltage side of the three-winding transformer, the instantaneous reduction signal of the medium-voltage side voltage at the high-voltage side in the three-winding transformer, the instantaneous reduction signal of the medium-voltage side current at the high-voltage side in the three-winding transformer, the instantaneous reduction signal of the low-voltage side voltage of the three-winding transformer at the high-voltage side, and the instantaneous reduction signal of the low-voltage side current of the three-winding transformer at the high-voltage side are converted into phasor values, and a no-load loss and a load loss of the three-winding transformer are calculated based on the phasor values by using a phasor method.

The present invention has the following beneficial effects.

In the present invention, frequency domain shift processing is performed on collected signals by using a Hanning window-based windowing frequency shift algorithm to obtain a phasor expression of a loss calculation equation, thereby effectively reducing errors caused by the spectrum leakage and the picket fence effect and improving the result accuracy.

The advantage of this method is that it realizes the application of frequency shift in the loss calculation, eliminates asynchronous sampling errors by performing frequency domain shift on the windowed signal, and synchronizes the asynchronous problem, thereby effectively reducing impacts of the spectrum leakage and the picket fence effect and improving the result accuracy.

DETAILED DESCRIPTION

The present invention will be further described in detail hereinafter in conjunction with the drawings and specific embodiments.

Figure 1:
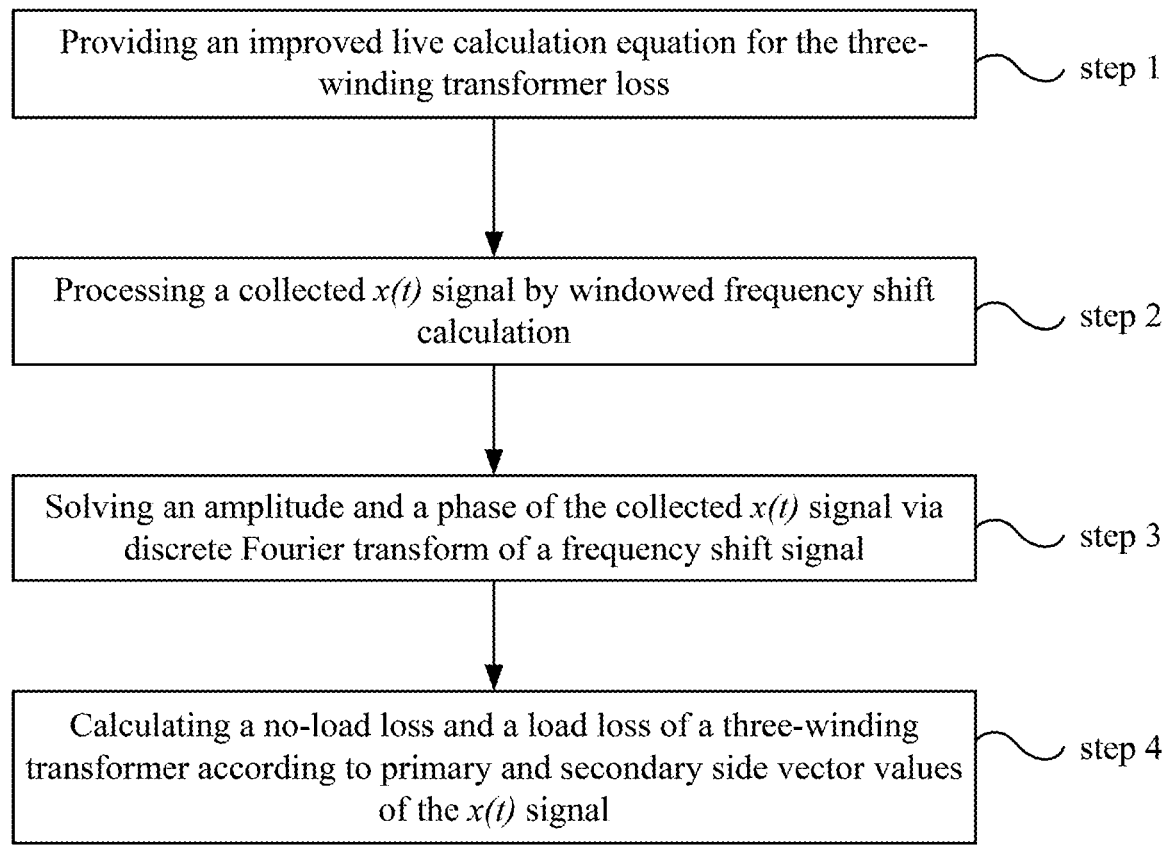
FIG. 1 is a flowchart of the present invention.

As shown in FIG. 1, the live measurement method for three-winding transformer loss based on windowed frequency shift designed in the present invention includes steps 1-4 described below.

In step 1, an improved live calculation equation for the three-winding transformer loss is established by using a three-winding transformer equivalent circuit, and an instantaneous voltage value $v_1$ of a high-voltage side of a three-winding transformer, an instantaneous current value $i_1$ of a high-voltage side of the three-winding transformer, an instantaneous reduction value $v_2'$ of a medium-voltage side voltage at a high-voltage side in the three-winding transformer, an instantaneous reduction value $i_2'$ of a medium-voltage side current at the high-voltage side in the three-winding transformer, an instantaneous reduction value $v_3'$ of a low-voltage side voltage of the three-winding transformer at the high-voltage side, and an instantaneous reduction value $i_3'$ of a low-voltage side current of the three-winding transformer at the high-voltage side are determined according to the improved live calculation equation for the three-winding transformer loss.

In step 2, windowed discrete-time Fourier transform equations of an instantaneous voltage signal of the high-voltage side of the three-winding transformer, an instantaneous current signal of the high-voltage side of the three-winding transformer, an instantaneous reduction signal of the medium-voltage side voltage at the high-voltage side in the three-winding transformer, an instantaneous reduction signal of the medium-voltage side current at the high-voltage side in the three-winding transformer, an instantaneous reduction signal of the low-voltage side voltage of the three-winding transformer at the high-voltage side, and an instantaneous reduction signal of the low-voltage side current of the three-winding transformer at the high-voltage side are calculated by using a windowing algorithm.

In step 3, frequency shift processing is performed on the windowed discrete-time Fourier transform equations obtained in step 2, and Fourier transform is performed on the frequency-shifted discrete-time Fourier transform equations to obtain amplitudes and phases of the instantaneous voltage signal of the high-voltage side of the three-winding transformer, the instantaneous current signal of the high-voltage side of the three-winding transformer, the instantaneous reduction signal of the medium-voltage side voltage at the high-voltage side in the three-winding transformer, the instantaneous reduction signal of the medium-voltage side current at the high-voltage side in the three-winding transformer, the instantaneous reduction signal of the low-voltage side voltage of the three-winding transformer at the high-voltage side, and the instantaneous reduction signal of the low-voltage side current of the three-winding transformer at the high-voltage side.

In step 4, the amplitudes and phases of the instantaneous signal of the high-voltage side voltage of the three-winding transformer, the instantaneous signal of the high-voltage side current of the three-winding transformer, the instantaneous reduction signal of the medium-voltage side voltage at the high-voltage side in the three-winding transformer, the instantaneous reduction signal of the medium-voltage side current at the high-voltage side in the three-winding transformer, the instantaneous reduction signal of the low-voltage side voltage of the three-winding transformer at the high-voltage side, and the instantaneous reduction signal of the low-voltage side current of the three-winding transformer at the high-voltage side are converted into phasor values, and a no-load loss and a load loss of the three-winding transformer are calculated based on the phasor values by using a phasor method.

Step 1 in the above solution includes steps 101, 102, and 103 described below.

In step 101, a three-winding transformer equivalent circuit is established.

Using a three-winding step-down transformer as an example, a high-voltage winding is connected to a power supply side, and other two windings have voltage outputs. The three windings are coupled with each other, and have a complex magnetic field. In order to establish the equivalent circuit, the concept of equivalent reactance is introduced. The equivalent reactance (integrated leakage reactance) of high, middle and low voltage windings each includes the self-inductive reactance of the respective winding and the mutual inductive reactance between the windings. The impedances $Z_1$, $Z_2'$ and $Z_3'$ corresponding to the equivalent reactance of each winding are called the equivalent impedance (integrated impedance), and are converted to the value of the primary side. The simplified equivalent circuit of the three winding transformer is shown in FIG. 2.

In the three-winding transformer equivalent circuit, $Z_1$ is set to an impedance of a high-voltage winding, $Z_2'$ to a reduction value of an impedance of a middle-voltage winding at the high-voltage side, $Z_3'$ to a reduction value of an impedance of a low-voltage winding at the high-voltage side, $Z_m$ to an excitation impedance, $v_1$ to an instantaneous voltage value of the high-voltage side, $i_1$ to an instantaneous current value of the high-voltage side, $v_2'$ to an instantaneous reduction value of a medium-voltage side voltage at the high-voltage side, $i_2'$ to an instantaneous reduction value of a medium-voltage side current at the high-voltage side, $v_3'$ to an instantaneous reduction value of a low-voltage side voltage at the high-voltage side, $i_3'$ to an instantaneous reduction value of a low-voltage side current at the high-voltage side, and $i_m$ to an excitation current.

Figure 2:
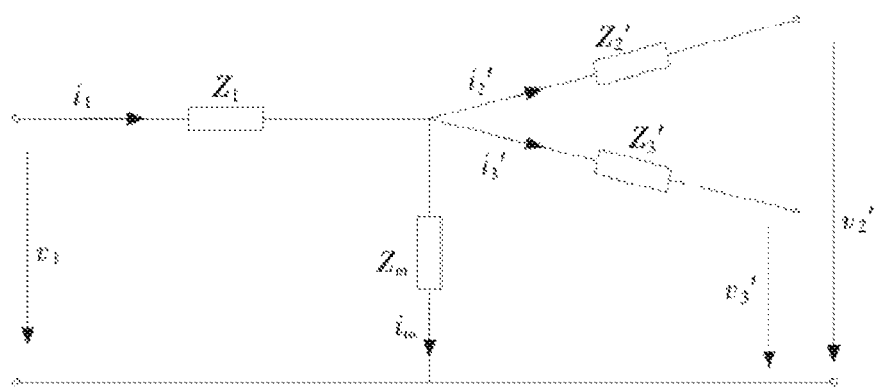
FIG. 2 shows a simplified equivalent circuit of a three-winding transformer.

In step 102, a calculation equation for a no-load loss and a load loss in three-winding transformer live detection in the presence of a simplified equivalent circuit such as shown in FIG. 2 is obtained.

$$P_{loss} = \frac{1}{T}\int_0^T v_1 i_1 dt - \frac{1}{T}\int_0^T v_2' i_2' dt - \frac{1}{T}\int_0^T v_3' i_3' dt = \quad (1)$$

-continued $$\frac{1}{T}\int_0^T v_1(i_1 - i_2' - i_3')dt + \frac{1}{T}\int_0^T (v_1 - v_2')i_2'dt + \frac{1}{T}\int_0^T (v_1 - v_3')i_3'dt$$

In Equation (1), T denotes a sampling period, t denotes a sampling duration, and $P_{loss}$ denotes a total loss, where a transformer total loss $P_{loss}$ includes a no-load loss $P_{Fe}$ and a load loss $P_{Cu}$.

For a power transformer, the following relations are obtained approximately.

$$P_{Fe} \approx \frac{1}{T}\int_0^T v_1(i_1 - i_2' - i_3')dt \quad (2)$$

$$P_{Cu} \approx \frac{1}{T}\int_0^T (v_1 - v_2')i_2'dt + \frac{1}{T}\int_0^T (v_1 - v_3')i_3'dt \quad (3)$$

In Equations (2) and (3), $P_{Fe}$ is the no-load loss, and $P_{Cu}$ is the load loss.

In step 103, a loss calculation equation in the three-winding transformer live detection is improved.

The premise of establishment of replacing a voltage on an excitation branch with a voltage of the high-voltage side in Equations (2) and (3) is that a ratio of an equivalent impedance of the high-voltage side winding to a total impedance of the excitation branch is less than 1%, and that voltage drop caused by the equivalent impedance of the high-voltage side winding accounts for less than 1% of a rated voltage at high-voltage side incoming line of the transformer. However, in actual cases, magnitudes of the three winding impedances $Z_1$, $Z_2'$ and $Z_3'$ are related to a relative position of a core of each winding. In the three-winding step-down transformer, a middle-voltage winding is arranged in a middle position between a high-voltage winding and a low-voltage winding, that is, windings arranged outwardly from a hollow column are the low-voltage winding, the middle-voltage winding and the high-voltage winding sequentially and the middle-voltage winding is in the middle. The equivalent impedance of the middle-voltage winding is approximately zero, and usually is considered as a very small negative value. Equation (1) is split and recombined by using the characteristic that the impedance of the middle-voltage winding is very small to obtain the following equations.

$$P_{loss} = \frac{1}{T}\int_0^T v_1 i_1 dt - \frac{1}{T}\int_0^T v_2' i_2' dt - \frac{1}{T}\int_0^T v_3' i_3' dt = \quad (4)$$

$$\frac{1}{T}\int_0^T v_2'(i_1 - i_2' - i_3')dt + \frac{1}{T}\int_0^T (v_1 - v_2')i_1 dt + \frac{1}{T}\int_0^T (v_2' - v_3')i_3' dt$$

$$P_{Fe} \approx \frac{1}{T}\int_0^T v_2'(i_1 - i_2' - i_3')dt \quad (5)$$

$$P_{Cu} \approx \frac{1}{T}\int_0^T (v_1 - v_2')i_1 dt + \frac{1}{T}\int_0^T (v_2' - v_3')i_3' dt \quad (6)$$

Step 2 in the above solution includes steps described below.

A high-voltage side voltage signal of the three-winding transformer, a high-voltage side current signal of the three-winding transformer, a reduction signal of the medium-voltage side voltage at the high-voltage side in the three-winding transformer, a reduction signal of the medium-voltage side current at the high-voltage side in the three-winding transformer, a reduction signal of the low-voltage side voltage of the three-winding transformer at the high-voltage side, and a reduction signal of the low-voltage side current of the three-winding transformer at the high-voltage side each are set to be represented by x(t). A frequency of x(t) is f, an amplitude thereof is $A_1$, and an initial phase thereof is $\varphi_1$, so an expression of each x(t) is as follows.

$$x(t) = A_1 e^{j(2\pi f t + \varphi_1)} \quad (7)$$

In the above expression, e denotes a natural constant, j denotes an imaginary unit, and t denotes a sampling duration.

A discrete signal of the x(t) is obtained by performing sampling on the high-voltage side voltage signal of the three-winding transformer, the high-voltage side current signal of the three-winding transformer, the reduction signal of the medium-voltage side voltage at the high-voltage side in the three-winding transformer, the reduction signal of the medium-voltage side current at the high-voltage side in the three-winding transformer, the reduction signal of the low-voltage side voltage of the three-winding transformer at the high-voltage side, and the reduction signal of the low-voltage side current of the three-winding transformer at the high-voltage side. The time domain form of the applied Hanning window is $w_H(n)$, and the frequency domain form thereof $W_H(e^{jw})$ is shown in Equation (8).

$$W_H(\omega) = 0.5 W_R(\omega) + 0.25\left[W_R\left(\omega - \frac{2\pi}{N}\right) + W_R\left(\omega + \frac{2\pi}{N}\right)\right] \quad (8)$$

$$W_R(\omega) = \sin(\omega N/2)/[N\sin(\omega/2)] \quad (9)$$

In the above equations, N is the number of samplings in the sampling period T, $\omega$ is a parameter form of a discrete parameter n in a frequency domain, and $e^{jw}$ is a Euler's formula represented by $\omega$, and $e^{jw} = \cos w + j\sin w$.

The following equation is obtained after x(n) is windowed and truncated (the calculation can only be made for signals with a limited length, so the original signal is truncated by sampling time T, that is, limited).

$$x_m(n) = x(n)w_H(n), n = 0, 1, \ldots N-1 \quad (10)$$

A discrete-time Fourier transform value of the windowed signal $x_m(n)$ is as follows.

$$X_m(e^{jw}) = \sum_{n=-jw}^{\infty} x(n)w_H(n)e^{-jw} = W_H(\omega - \omega_1)e^{j(\phi_1 - \frac{N-1}{2}\omega)} \quad (11)$$

In the above equation, $\omega_1 = 2\pi f$, representing a corresponding angular frequency when a frequency of the high-voltage side voltage signal of the transformer is f.

Step 3 in the above solution includes steps 301-304 described below.

In step 301, a frequency shift processing method for an x(t) signal under a condition of asynchronous sampling (the actual frequency and the collected frequency of the voltage and current signals in the grid are not synchronized) is proposed.

A peak frequency $f_m$ of $X_m(e^{jw})$ is shown in Equation (12).

$$f_m = k\frac{f_s}{N} \quad (12)$$

In Equation (12), k denotes a discrete frequency point spectrum line corresponding to a frequency of the measured x(t) signal, $f_s$ is a sampling frequency, and N is the number of samplings in the sampling period T. Since $f_m$ is hardly exactly at the discrete frequency point of the spectrum line, that is, k is generally not an integer, so let $k=k_m+\delta_m$, where $k_m$ is an integer on the closest discrete frequency point, and $\delta_m$ denotes a frequency shift.

A peak point of the x(t) signal may be deviated under the condition of asynchronous sampling, so the signal will be shifted by $\delta_m$ quantized frequency units to the left or right by using a windowed frequency shift algorithm (in step 302, the signal is shifted to the right, and in step 303, the signal is shifted to the left) such that the measured frequency point coincides with a discrete frequency point of a real spectrum to obtain an accurate signal spectrum.

In step 302, the frequency shift $\delta_m$ in a case where a maximum value and a sub-maximum value near a spectral peak are at $k_m$ and $k_m+1$ respectively is calculated.

A variable $\omega=k_m 2\pi/N$ is substituted into Equations (8) and (9) to obtain the following equation.

$$|X_m(e^{jw})|_{\omega=k_m\frac{2\pi}{N}} = A_1 \left|W_H\left\{[k_m-(k_m+\delta_m)]\frac{2\pi}{N}\right\}\right| \approx \tag{13}$$
$$A_1\left\{0.5\frac{\sin(\pi\delta_m)}{\pi\delta_m} + 0.25\left\{\frac{\sin[\pi(\delta_m-1)]}{\pi(\delta_m-1)}+\frac{\sin[\pi(\delta_m+1)]}{\pi(\delta_m+1)}\right\}\right\} \approx$$
$$A_1\left\{0.5\frac{\sin(\pi\delta_m)}{\pi\delta_m} + 0.25\left\{\frac{(\delta_m+1)\sin[\pi(\delta_m-1)]}{\pi(\delta_m+1)(\delta_m-1)}+\frac{(\delta_m-1)\sin[\pi(\delta_m+1)]}{\pi(\delta_m+1)(\delta_m-1)}\right\}\right\}$$

In Equation (13), $\sin[\pi(1-\delta_m)]=\sin\pi\cos(-\pi\delta_m)+\cos\pi\sin(-\pi\delta_m)=\sin(\pi\delta_m)$, and $\sin[\pi(1+\delta_m)]=\sin\pi\cos(\pi\delta_m)+\cos\pi\sin(\pi\delta_m)=-\sin(\pi\delta_m)$, so Equation (13) is simplified as follows.

$$|X_m(e^{jw})|_{\omega=k_m\frac{2\pi}{N}} \approx \frac{A_1\sin(\pi\delta_m)}{2\delta_m(1-\delta_m^2)\pi} \tag{14}$$

A variable $\omega=(k_m+1)2\pi/N$ is substituted into Equations (8) and (11) to obtain the following equation.

$$|X_m(e^{jw})|_{\omega=(k_m+1)\frac{2\pi}{N}} \approx \frac{A_1\sin(\pi\delta_m)}{2\pi\delta_m(1-\delta_m)(2-\delta_m)} \tag{15}$$

A ratio of a spectrum value at the discrete frequency point $k_m+1$ to a spectrum value at the discrete frequency point $k_m$ is set to $\beta$.

$$\beta = \frac{|X_m(e^{jw})|_{\omega=(k_m+1)\frac{2\pi}{N}}}{|X_m(e^{jw})|_{\omega=k_m\frac{2\pi}{N}}} = \frac{1-\delta_m}{\delta_m+2} \tag{16}$$

The frequency shift $\delta_m$ is derived from Equation (16).

$$\delta_m = \frac{2\beta-1}{1+\beta} \tag{17}$$

In step 303, the frequency shift $\delta_m$ in a case where a maximum value and a sub-maximum value near the spectral peak are at $k_m$ and $k_m-1$ respectively is calculated.

A variable $\omega=k_m 2\pi/N$ is substituted into Equations (8) and (11).

A variable $\omega=(k_m-1)2\pi/N$ is substituted into Equations (8) and (11) to obtain the following equations.

$$|X_m(e^{jw})|_{\omega=k_m\frac{2\pi}{N}} \approx \frac{A_1\sin(\pi\delta_m)}{2\delta_m(1-\delta_m^2)\pi} \tag{18}$$

$$|X_m(e^{jw})|_{\omega=(k_m-1)\frac{2\pi}{N}} \approx \frac{A_1\sin(\pi\delta_m)}{2\pi\delta_m(\delta_m+1)(\delta_m+2)} \tag{19}$$

$$\beta = \frac{|X_m(e^{jw})|_{\omega=(k_m+1)\frac{2\pi}{N}}}{|X_m(e^{jw})|_{\omega=k_m\frac{2\pi}{N}}} = \frac{1-\delta_m}{\delta_m+2} \tag{20}$$

The frequency shift $\delta_m$ is derived from Equation (20).

$$\delta_m = \frac{2\beta-1}{1+\beta} \tag{21}$$

It can be seen that the expressions of $\delta_m$ obtained in the two cases are the same.

In step 304, the amplitude $A_1$ and initial phase $\varphi 1$ of the signal x(t) are solved.

The signal $x_m(n)$ is shifted in the frequency domain by $\delta_m$ frequency units to obtain the following equation.

$$x_s(n) = x_m(n)e^{j\frac{2\pi n}{N}\delta_m} \tag{22}$$

Discrete Fourier transform is performed on the expression $x_s(n)$ according to Equation (23) after processing of signal frequency shift.

$$X_s(k_s) = \sum_{n=0}^{N-1} x_s(n)e^{-j\frac{2\pi n}{N}k_s} \tag{23}$$

In the above equation, $k_s$ represents an integral discrete frequency point spectrum line corresponding to the frequency of the x(t) signal.

The amplitude $A_1$ and initial phase $\varphi 1_1$ of the signal x(t) are obtained.

$$A_1 = |X_s(k_s)|\frac{4}{N} \tag{24}$$

$$\phi_1 = \text{angle}(X_s(k_s)) \tag{25}$$

Step 4 in the above solution specifically includes steps described below.

After the above data processing, an amplitude and phase of the x(t) signal in Equations (5) and (6) are obtained by collecting discrete values of the x(t) signal, and the no-load loss and the load loss of the transformer (there are three windings, i.e., high, middle and low-voltage side windings, and the loss equivalent calculation is carried out at the high-voltage side) with phasor values representing a voltage U and a current I respectively are as follows.

$$P_{Fe} = Re[U_2'(I_1'^* - I_2'^* - I_3'^*)] \quad (26)$$

$$P_{Cu} = Re[(U_1 - U_2')I_1'^* + (U_2'^* - U_3'^*)I_3'^*] \quad (27)$$

In Equations (26) and (27), $R_e$ denotes a real part of the phasor, * represents a conjugation, $I_1^*$ is a conjugate phase expression for $i_1$, $I_2'^*$ is a conjugate phase expression for $i_2'$, $I_3'^*$ is a conjugate phase expression for $i_3'$, $U_1$ is a phase expression for $v_1$, $U_2'$ is a phase expression for $v_2'$, $U_2'^*$ is a conjugate phase expression for $v_2'$, and $U_3'^*$ is a conjugate phase expression for $v_3'$.

What is claimed is:

1. A live measurement method for three-winding transformer loss based on windowed frequency shift, comprising following steps:

step 1: establishing an improved live calculation equation for the three-winding transformer loss by using a three-winding transformer equivalent circuit, and determining, according to the improved live calculation equation for the three-winding transformer loss, an instantaneous voltage value $v_1$ of a high-voltage side of a three-winding transformer, an instantaneous current value $i_1$ of the high-voltage side of the three-winding transformer, an instantaneous reduction value $v_2'$ of a medium-voltage side voltage at the high-voltage side in the three-winding transformer, an instantaneous reduction value $i_2'$ of a medium-voltage side current at the high-voltage side in the three-winding transformer, an instantaneous reduction value $v_3'$ of a low-voltage side voltage of the three-winding transformer at the high-voltage side, and an instantaneous reduction value $i_3'$ of a low-voltage side current of the three-winding transformer at the high-voltage side;

step 2: calculating, by using a windowing algorithm, windowed discrete-time Fourier transform equations of an instantaneous voltage signal of the high-voltage side of the three-winding transformer, an instantaneous current signal of the high-voltage side of the three-winding transformer, an instantaneous reduction signal of the medium-voltage side voltage at the high-voltage side in the three-winding transformer, an instantaneous reduction signal of the medium-voltage side current at the high-voltage side in the three-winding transformer, an instantaneous reduction signal of the low-voltage side voltage of the three-winding transformer at the high-voltage side, and an instantaneous reduction signal of the low-voltage side current of the three-winding transformer at the high-voltage side;

step 3: performing frequency shift processing on the windowed discrete-time Fourier transform equations obtained in the step 2, and performing Fourier transform on the frequency-shifted discrete-time Fourier transform equations to obtain amplitudes and phases of the instantaneous voltage signal of the high-voltage side of the three-winding transformer, the instantaneous current signal of the high-voltage side of the three-winding transformer, the instantaneous reduction signal of the medium-voltage side voltage at the high-voltage side in the three-winding transformer, the instantaneous reduction signal of the medium-voltage side current at the high-voltage side in the three-winding transformer, the instantaneous reduction signal of the low-voltage side voltage of the three-winding transformer at the high-voltage side, and the instantaneous reduction signal of the low-voltage side current of the three-winding transformer at the high-voltage side; and step 4: converting the amplitudes and the phases of the instantaneous voltage signal of the high-voltage side of the three-winding transformer, the instantaneous current signal of the high-voltage side of the three-winding transformer, the instantaneous reduction signal of the medium-voltage side voltage at the high-voltage side in the three-winding transformer, the instantaneous reduction signal of the medium-voltage side current at the high-voltage side in the three-winding transformer, the instantaneous reduction signal of the low-voltage side voltage of the three-winding transformer at the high-voltage side, and the instantaneous reduction signal of the low-voltage side current of the three-winding transformer at the high-voltage side into phasor values, and calculating a no-load loss and a load loss of the three-winding transformer based on the phasor values by using a phasor method;

wherein the live measurement method for three-winding transformer loss based on windowed frequency shift further comprises:

determining an operating state of the three-winding transformer according to the no-load loss and the load loss of the three-winding transformer.

2. The live measurement method for three-winding transformer loss based on windowed frequency shift of claim 1, wherein the step 1 comprises following steps:

step 101: establishing the three-winding transformer equivalent circuit, and in the three-winding transformer equivalent circuit, setting $Z_1$ to an impedance of a high-voltage winding, $Z_2'$ to a reduction value of an impedance of a middle-voltage winding at the high-voltage side, $Z_3'$ to a reduction value of an impedance of a low-voltage winding at the high-voltage side, $Z_m$ to an excitation impedance, $v_1$ to the instantaneous voltage value of the high-voltage side, $i_1$ to the instantaneous current value of the high-voltage side, $v_2'$ to the instantaneous reduction value of a medium-voltage side voltage at the high-voltage side, $i_2'$ to the instantaneous reduction value of a medium-voltage side current at the high-voltage side, $v_3'$ to the instantaneous reduction value of a low-voltage side voltage at the high-voltage side, $i_3'$ to the instantaneous reduction value of a low-voltage side current at the high-voltage side, and $i_m$ to an excitation current;

step 102: obtaining a calculation equation for a no-load loss and a load loss in three-winding transformer live detection in the presence of a simplified equivalent circuit, $$P_{loss} = \frac{1}{T}\int_0^T v_1 i_1 dt - \frac{1}{T}\int_0^T v_2' i_2' dt - \frac{1}{T}\int_0^T v_3' i_3' dt = \quad (1)$$
$$\frac{1}{T}\int_0^T v_1(i_1 - i_2' - i_3')dt + \frac{1}{T}\int_0^T (v_1 - v_2')i_2' dt + \frac{1}{T}\int_0^T (v_1 - v_3')i_3' dt$$

wherein in Equation (1), T denotes a sampling period, t denotes a sampling duration, and $P_{loss}$ denotes a total loss, wherein a total transformer loss $P_{loss}$ comprises a no-load loss $P_{Fe}$ and a load loss $P_{Cu}$; and for a power transformer, following relations are obtained approximately:

$$P_{Fe} \approx \frac{1}{T}\int_0^T v_1(i_1 - i_2' - i_3')dt \quad (2)$$

-continued $$P_{Cu} \approx \frac{1}{T}\int_0^T (v_1 - v_2')i_2'dt + \frac{1}{T}\int_0^T (v_1 - v_3')i_3'dt \qquad (3)$$

wherein in Equations (2) and (3), $P_{Fe}$ is the no-load loss, and $P_{Cu}$ is the load loss; and step 103: improving a loss calculation equation in the three-winding transformer live detection;

wherein a premise of establishment of replacing a voltage on an excitation branch with a voltage of the high-voltage side in Equations (2) and (3) is that a ratio of an equivalent impedance of a high-voltage side winding to a total impedance of the excitation branch is less than 1%, and that voltage drop caused by the equivalent impedance of the high-voltage side winding accounts for less than 1% of a rated voltage at high-voltage side incoming line of a transformer, while in actual cases, magnitudes of the three winding impedances $Z_1$, $Z_2'$ and $Z_3'$ are related to a relative position of a core of each winding, and in a three-winding step-down transformer, a middle-voltage winding is arranged in a middle position between a high-voltage winding and a low-voltage winding, that is, windings arranged outwardly from a hollow column are the low-voltage winding, the middle-voltage winding and the high-voltage winding sequentially and the middle-voltage winding is in the middle, so Equation (1) is split and combined:

$$P_{loss} = \frac{1}{T}\int_0^T v_1 i_1 dt - \frac{1}{T}\int_0^T v_2' i_2' dt - \frac{1}{T}\int_0^T v_3' i_3' dt = \qquad (4)$$
$$\frac{1}{T}\int_0^T v_2'(i_1 - i_2' - i_3')dt + \frac{1}{T}\int_0^T (v_1 - v_2')i_1 dt + \frac{1}{T}\int_0^T (v_2' - v_3')i_3' dt$$

$$P_{Fe} \approx \frac{1}{T}\int_0^T v_2'(i_1 - i_2' - i_3')dt \qquad (5)$$

$$P_{Cu} \approx \frac{1}{T}\int_0^T (v_1 - v_2')i_1 dt + \frac{1}{T}\int_0^T (v_2' - v_3')i_3' dt. \qquad (6)$$

3. The live measurement method for three-winding transformer loss based on windowed frequency shift of claim 1, wherein the step 2 comprises following steps:

setting a high-voltage side voltage signal of the three-winding transformer, a high-voltage side current signal of the three-winding transformer, a reduction signal of the medium-voltage side voltage at the high-voltage side in the three-winding transformer, a reduction signal of the medium-voltage side current at the high-voltage side in the three-winding transformer, a reduction signal of the low-voltage side voltage of the three-winding transformer at the high-voltage side, and a reduction signal of the low-voltage side current of the three-winding transformer at the high-voltage side each to be denoted by x(t), wherein a frequency of x(t) is f, an amplitude thereof is $A_1$, and an initial phase thereof is $\varphi_1$, so an expression of each x(t) is:

$$x(t) = A_1 e^{j(2\pi ft + \varphi_1)} \qquad (7)$$

wherein e denotes a natural constant, j denotes an imaginary unit, and t denotes a sampling duration;

obtaining a discrete signal x(n) of x(t) by performing sampling on the high-voltage side voltage signal of the three-winding transformer, the high-voltage side current signal of the three-winding transformer, the reduction signal of the medium-voltage side voltage at the high-voltage side in the three-winding transformer, the reduction signal of the medium-voltage side current at the high-voltage side in the three-winding transformer, the reduction signal of the low-voltage side voltage of the three-winding transformer at the high-voltage side, and the reduction signal of the low-voltage side voltage of the three-winding transformer at the high-voltage side, wherein a time domain form of an applied Hanning window is $w_H(n)$, and a frequency domain form $W_H(e^{jw})$ is shown in Equation (10):

$$W_H(\omega) = 0.5 W_R(\omega) + 0.25\left[W_R\left(\omega - \frac{2\pi}{N}\right) + W_R\left(\omega + \frac{2\pi}{N}\right)\right] \qquad (8)$$

$$W_R(\omega) = \sin(\omega N/2)/[N\sin(\omega/2)] \qquad (9)$$

wherein N is a number of samplings in the sampling period T, ω is a parameter form of a discrete parameter n in a frequency domain, $e^{jw}$ is a Euler's formula represented by ω, and $e^{jw}$=cosw+isinw;

windowing and truncating x(n) to obtain:

$$x_m(n) = x(n)w_H(n), n=0,1,\ldots N-1 \qquad (10); \text{ and}$$

obtaining a discrete-time Fourier transform value of the windowed signal $x_m(n)$:

$$X_m(e^{jw}) = \sum_{n=-jw}^{\infty} x(n)w_H(n)e^{-jw} = W_H(\omega - \omega_1)e^{j(\phi_1 - \frac{N-1}{2}\omega)} \qquad (11)$$

wherein $\omega_1 = 2\pi f$, representing a corresponding angular frequency when a frequency of the high-voltage side voltage signal of the transformer is f.

4. The live measurement method for three-winding transformer loss based on windowed frequency shift of claim 1, wherein the step 3 comprises following steps:

step 301: providing an frequency shift processing method for x(t) signal under a condition of asynchronous sampling;

wherein a peak frequency $f_m$ of $X_m(e^{jw})$ is shown in Equation (14), $$f_m = k\frac{f_s}{N}, \qquad (12)$$

wherein in Equation (12), k denotes a discrete frequency point spectrum line corresponding to a frequency of the measured x(t) signal, $f_s$ denotes a sampling frequency, N is the number of samplings in the sampling period T, and $k = k_m + \delta_m$, where $k_m$ is an integer on a closest discrete frequency point, and $\delta_m$ denotes a frequency shift; and a peak point of the x(t) signal may be deviated under the condition of asynchronous sampling, so that the signal is shifted by $\delta_m$ quantized frequency units to the left or right by using a windowing frequency shift algorithm such that the measured frequency point coincides with a discrete frequency point of a real spectrum to obtain an accurate signal spectrum;

step 302: calculating the frequency shift $\delta_m$ in a case where a maximum value and a sub-maximum value near a spectral peak are at $k_m$ and km+1 respectively; wherein a variable $\omega=k_m 2\pi/N$ is substituted into Equations (8) and (9) to obtain $$|X_m(e^{jw})|_{\omega=k_m\frac{2\pi}{N}} = A_1\left|W_H\left\{[k_m-(k_m+\delta_m)]\frac{2\pi}{N}\right\}\right| \approx \qquad (13)$$

$$A_1\left\{0.5\frac{\sin(\pi\delta_m)}{\pi\delta_m} + 0.25\left\{\frac{\sin[\pi(\delta_m-1)]}{\pi(\delta_m-1)} + \frac{\sin[\pi(\delta_m+1)]}{\pi(\delta_m+1)}\right\}\right\} \approx$$

$$A_1\left\{0.5\frac{\sin(\pi\delta_m)}{\pi\delta_m} + 0.25\left\{\frac{(\delta_m+1)\sin[\pi(\delta_m-1)]}{\pi(\delta_m+1)(\delta_m-1)} + \frac{(\delta_m-1)\sin[\pi(\delta_m+1)]}{\pi(\delta_m+1)(\delta_m-1)}\right\}\right\},$$

wherein in Equation (15), $\sin[\pi(1-\delta_m)]=\sin\pi\cos(-\pi\delta_m)+\cos\pi\sin(-\pi\delta_m)=\sin(\pi\delta_m)$, and $\sin[\pi(1+\delta_m)]=\sin\pi\cos(\pi\delta_m)+\cos\pi\sin(\pi\delta_m)=-\sin(\pi\delta_m)$, so Equation (13) is simplified as $$|X_m(e^{jw})|_{\omega=k_m\frac{2\pi}{N}} \approx \frac{A_1\sin(\pi\delta_m)}{2\delta_m(1-\delta_m^2)\pi}; \qquad (14)$$

a variable $\omega=(k_m+1)2\pi/N$ is substituted into Equations (8) and (11) to obtain $$|X_m(e^{jw})|_{\omega=(k_m+1)\frac{2\pi}{N}} \approx \frac{A_1\sin(\pi\delta_m)}{2\pi\delta_m(1-\delta_m)(2-\delta_m)}; \qquad (15)$$

a ratio of a spectrum value at the discrete frequency point $k_m+1$ to a spectrum value at the discrete frequency point $k_m$ is set to $\beta$, $$\beta = \frac{|X_m(e^{jw})|_{\omega=(k_m+1)\frac{2\pi}{N}}}{|X_m(e^{jw})|_{\omega=k_m\frac{2\pi}{N}}} = \frac{1-\delta_m}{\delta_m+2}; \qquad (16)$$

and
the frequency shift $\delta_m$ is derived from Equation (16)

$$\delta_m = \frac{2\beta-1}{1+\beta}; \qquad (17)$$

step 303: calculating the frequency shift $\delta_m$ in a case where a maximum value and a sub-maximum value near the spectral peak are at $k_m$ and $k_m+1$ respectively; wherein a variable $\omega=k_m 2\pi/N$ is substituted into Equations (8) and (11);
a variable $\omega=(k_m+1)2\pi/N$ is substituted into Equations (8) and (11) to obtain $$|X_m(e^{jw})|_{\omega=k_m\frac{2\pi}{N}} \approx \frac{A_1\sin(\pi\delta_m)}{2\delta_m(1-\delta_m^2)\pi} \qquad (18)$$

$$|X_m(e^{jw})|_{\omega=(k_m-1)\frac{2\pi}{N}} \approx \frac{A_1\sin(\pi\delta_m)}{2\pi\delta_m(\delta_m+1)(\delta_m+2)} \qquad (19)$$

$$\beta = \frac{|X_m(e^{jw})|_{\omega=(k_m+1)\frac{2\pi}{N}}}{|X_m(e^{jw})|_{\omega=k_m\frac{2\pi}{N}}} = \frac{1-\delta_m}{\delta_m+2}; \qquad (20)$$

and
the frequency shift $\omega_m$ is derived from Equation (20)

$$\delta_m = \frac{2\beta-1}{1+\beta}, \qquad (21)$$

wherein $\omega_m$ obtained in the two cases have a same expression; and step 304: solving an amplitude $A_1$ and an initial phase $\varphi 1$ of the signal x(t):
wherein the signal $x_m(n)$ is shifted in the frequency domain by $\delta_m$ frequency units to obtain $$x_s(n) = x_m(n)e^{j\frac{2\pi n}{N}\delta_m}; \qquad (22)$$

discrete Fourier transform is performed on the expression $x_s(n)$ according to Equation (23) after processing of signal frequency shift $$X_s(k_s) = \sum_{n=0}^{N-1} x_s(n)e^{-j\frac{2\pi n}{N}k_s}, \qquad (23)$$

wherein $k_s$ denotes an integral discrete frequency point spectrum line corresponding to the frequency of the x(t) signal; and
the amplitude $A_1$ and the initial phase $\varphi 1$ of the signal x(t) are obtained $$A_1 = |X_s(k_s)|\frac{4}{N} \qquad (24)$$

$$\phi_1 = \text{angle}(X_s(k_s)). \qquad (25)$$

5. The live measurement method for three-winding transformer loss based on windowed frequency shift of claim 1, wherein
the step 4 comprises following steps:
after above data processing, obtaining an amplitude and an phase of the x(t) signal in Equations (5) and (6) by collecting discrete values of the x(t) signal, and obtaining the no-load loss and the load loss of the transformer with phasors representing a voltage U and a current I, respectively $$P_{Fe} = Re[U_2'(I_1^*-I_2'^*-I_3'^*)] \qquad (27)$$

$$P_{Cu} = Re[(U_1-U_2')I_1^*+(U_2'^*-U_3'^*)I_3'^*] \qquad (28),$$

wherein in Equations (27) and (28), $R_e$ denotes a real part of the phasor, * represents a conjugation, $I_1^*$ is a conjugate phase expression for $i_1$, $I_2'^*$ is a conjugate phase expression for $i_2'$, $I_3'^*$ is a conjugate phase expression for $i_3'$, $U_1$ is a phase expression for $v_1$, $U_2'$ is a phase expression for $v_2'$, $U_2'^*$ is a conjugate phase expression for $v_2'$, and $U_3'^*$ is a conjugate phase expression for $v_3'$.

\* \* \* \* \*